(12) United States Patent
Lattimore et al.

(10) Patent No.: US 6,195,280 B1
(45) Date of Patent: Feb. 27, 2001

(54) MEMORY SYSTEM HAVING A UNIDIRECTIONAL BUS AND METHOD FOR COMMUNICATING THEREWITH

(75) Inventors: George McNeil Lattimore, Austin, TX (US); Younes Lotfi, Colorado Springs, CO (US); Robert Anthony Ross, Jr., Cedar Park; Gus Wai-Yan Yeung, Austin, both of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/521,352

(22) Filed: Mar. 9, 2000

Related U.S. Application Data

(62) Division of application No. 09/140,368, filed on Aug. 26, 1998.

(51) Int. Cl.[7] .................................................. G11C 5/06
(52) U.S. Cl. ......................................... 365/63; 365/230.03
(58) Field of Search ................................. 365/230.03, 63

(56) References Cited

U.S. PATENT DOCUMENTS

| | | | | |
|---|---|---|---|---|
| 5,892,725 | * | 4/1999 | Lattimore et al. | 365/230.03 |
| 6,058,065 | * | 5/2000 | Lattimore et al. | 365/230.03 |

* cited by examiner

*Primary Examiner*—David Nelms
*Assistant Examiner*—M. Tran
(74) *Attorney, Agent, or Firm*—Winstead Sechrest & Minick P.C.; Anthony V. S. England

(57) ABSTRACT

A memory and a method for communicating therewith are implemented having a unidirectional write bus for writing to memory cells within a plurality of memory cell groups. Local bitlines associated with each of the memory cell groups communicate write data to the associated memory cell. Global bitlines coupled to all of the memory cells are decoupled from the local bitlines during a write operation. Following a write operation the local bitlines are restored by a precharge operation during which the global and local bitlines are also decoupled.

6 Claims, 6 Drawing Sheets

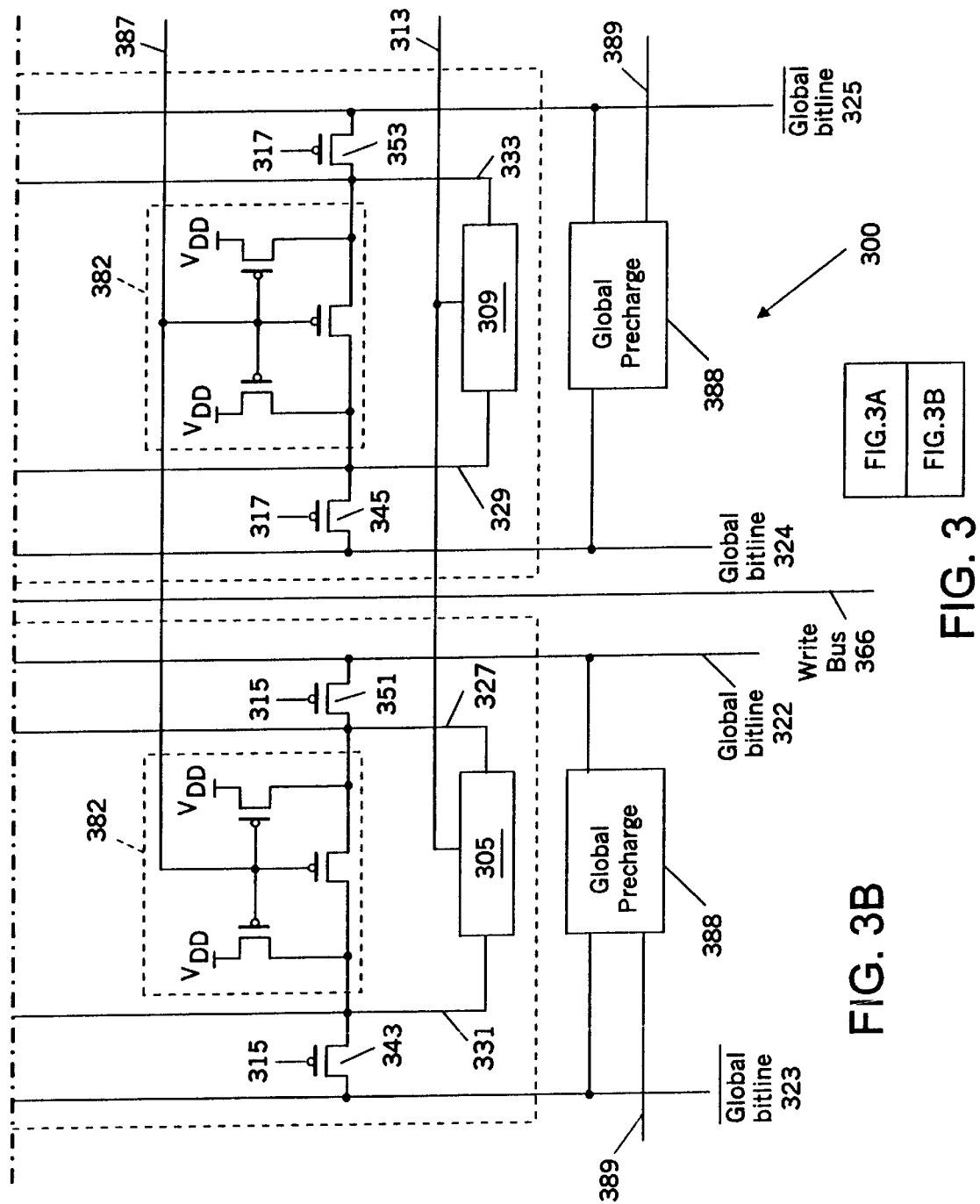

MEMORY SYSTEM HAVING A UNIDIRECTIONAL BUS AND METHOD FOR COMMUNICATING THEREWITH

CROSS-REFERENCE TO RELATED APPLICATIONS

This is a division of application Ser. No. 09/140,368 filed Aug. 26, 1998.

Related subject matter may be found in the following commonly assigned, co-pending U.S. Patent Applications, both of which are hereby incorporated by reference herein:

Ser. No. 09/082,540, entitled "A MEMORY IN A DATA PROCESSING SYSTEM HAVING IMPROVED PERFORMANCE AND METHOD THEREFOR" and filed May 21, 1998; and Ser. No. 09/078,248, entitled "MEMORY IN A DATA PROCESSING SYSTEM HAVING UNEVEN CELL GROUPING ON BITLINES AND METHOD THEREFOR" and filed May 13, 1998, which issued as U.S. Pat. No. 5,892,725 on Apr. 6, 1999.

TECHNICAL FIELD

The present invention relates in general to data processing systems, and in particular, to memory arrays in data processing systems.

BACKGROUND INFORMATION

Standard memory circuits, according to the prior art, use a common bus to read, write and refresh the bitlines. In FIG. 1. a memory 100 according to the prior art is illustrated. Memory 100 includes two columns of memory cells, bitline column 101 and bitline column 102. Each bitline includes a plurality of memory cells for the storage of data. For ease of illustration, bitline column 101 and bitline column 102 are each shown to include four memory cells, memory cells 103–106 in bitline column 101, and memory cells 107–110 in bitline column 102.

Prior to any read or write operation, the bitlines are precharged to $V_{DD}$. Precharge is initiated by asserting bitline precharge signal 111 thereby turning on p-type metal oxide semiconductor (PMOS) devices 112–114 in precharge circuit 115, and PMOS devices 116–118 in precharge circuit 119, respectively. PMOS device 114 equalizes bitlines 120 and 121 which are then pulled to $V_{DD}$ through PMOS devices 112 and 113. Similarly, bitlines 122 and 123 are equalized by PMOS device 118 and pulled to $V_{DD}$ by PMOS devices 116 and 117, respectively.

The precharge rate is limited by the capacitance on the bitlines. This limits the cycle time for memory 100. The capacitance on the bitline arises from the bitline wire capacitance and the capacitance of the semiconductor devices within the memory cells 103–106, and 107–110. As the number of cells on a bitline increases, the capacitance increases proportionately. Thus, as the size of memory 100 increases, the cycle time also increases as well.

After the bitlines are precharged, bitline precharge signal 111 is negated, turning off PMOS devices 112–114, and 116–118. Data can then be read from, or written to, one of memory cells 103–110. For a write operation, a data value on Data In line 124, and its complement on $\overline{\text{Data In}}$ line 125 are transferred to bitlines 120 or 122 and 121 or 123, respectively, via n-type metal oxide semiconductor (NMOS) devices 126, 127, 128 and 129. Data is transferred in response to a write select signal asserted on write select 130 if the write is to be made to one of memory cells 103–106 in bitline column 101, or on write select 131 if a write is to be made to one of memory cells 107–110 in bitline column 102. Asserting the write select signal on write select 130 turns on NMOS devices 126 and 127, and asserting a write select on write select 131 turns on NMOS devices 128 and 129. The turning on of NMOS device 126 couples Data In 124 to bitline 120, and the complementary data value on $\overline{\text{Data In}}$ 125 to bitline 121. Similarly, asserting write select 131, thereby turning on NMOS devices 128 and 129, couples Data In 124 to bitline 122 in bitline column 102, and the complementary data value on $\overline{\text{Data In}}$ 125 to bitline 123 in bitline column 102. Depending on the data value, one of Data In 124, and $\overline{\text{Data In}}$ 125 is logic "1" and the complementary input is logic "0." The coupling of bitlines 120 and 121 to Data In 124 and $\overline{\text{Data In}}$ 125, respectively, if write select 130 is asserted, or bitlines 122 and 123 to Data In 124 and $\overline{\text{Data In}}$ 125, respectively, if write select 131 is asserted, discharges the precharge on the bitlines. The one of bitlines 122 and 123 that is coupled to the one of Data In 124 or $\overline{\text{Data In}}$ 125 that is logic "0" is discharged to ground. Thus, the write operation also requires discharging of the capacitances appearing on the bitlines, and therefore, the write time performance of the memory is also limited by the bitline capacitance.

Hence, there is a need in the art in which the bitline capacitances that the precharge circuitry is required to charge during the precharge operation, or the write circuitry is required to discharge during a write operation, are reduced. The reduction of this capacitance improves the performance of such memory by reducing the precharge time, and the time required to write to such memory, permitting faster memory cycle rates.

SUMMARY OF THE INVENTION

The previously mentioned needs are addressed by the present invention. Accordingly, there is provided in a first form, a memory system having a unidirectional write bus. The memory includes a plurality of memory cell groups, each including a plurality of memory cells, and a plurality of first bitlines coupled to a corresponding one of the plurality of memory cell groups. Each of the first bitlines communicates write data for writing to one of the memory cells in the corresponding memory cell group. The memory further includes at least one second bitline coupled to each of the first bitlines, the second bitline communicating read data for reading from one of the memory cells. The second bitline is decoupled from each of the first bitlines during a write to one of the memory cells.

There is provided, in a second form, a method of communicating with a memory system. For a write operation, a plurality of first bitlines is decoupled from a second bitline and coupled to a data line. One bitline and associated memory cell group is selected for writing, and coupled to a data line for transmitting data to the associated memory cell group.

Additionally there is provided, in a third form a data processing system including a processor coupled via a bus to a storage system, a memory system, and an input/output system, wherein a memory system is located within one of said processor, storage system, memory system, or input/output system. The memory system contains a plurality of memory cells wherein the plurality of memory cells is partitioned into first and second memory cell groups. A first bitline is coupled to the first memory group and a second bitline is coupled to the second memory group. A third bitline is coupled to the first and second bitlines for communicating read data from the first and second memory cell groups, and a data line is coupled to said first and second bitlines for communicating write data to the first and second memory cell groups.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
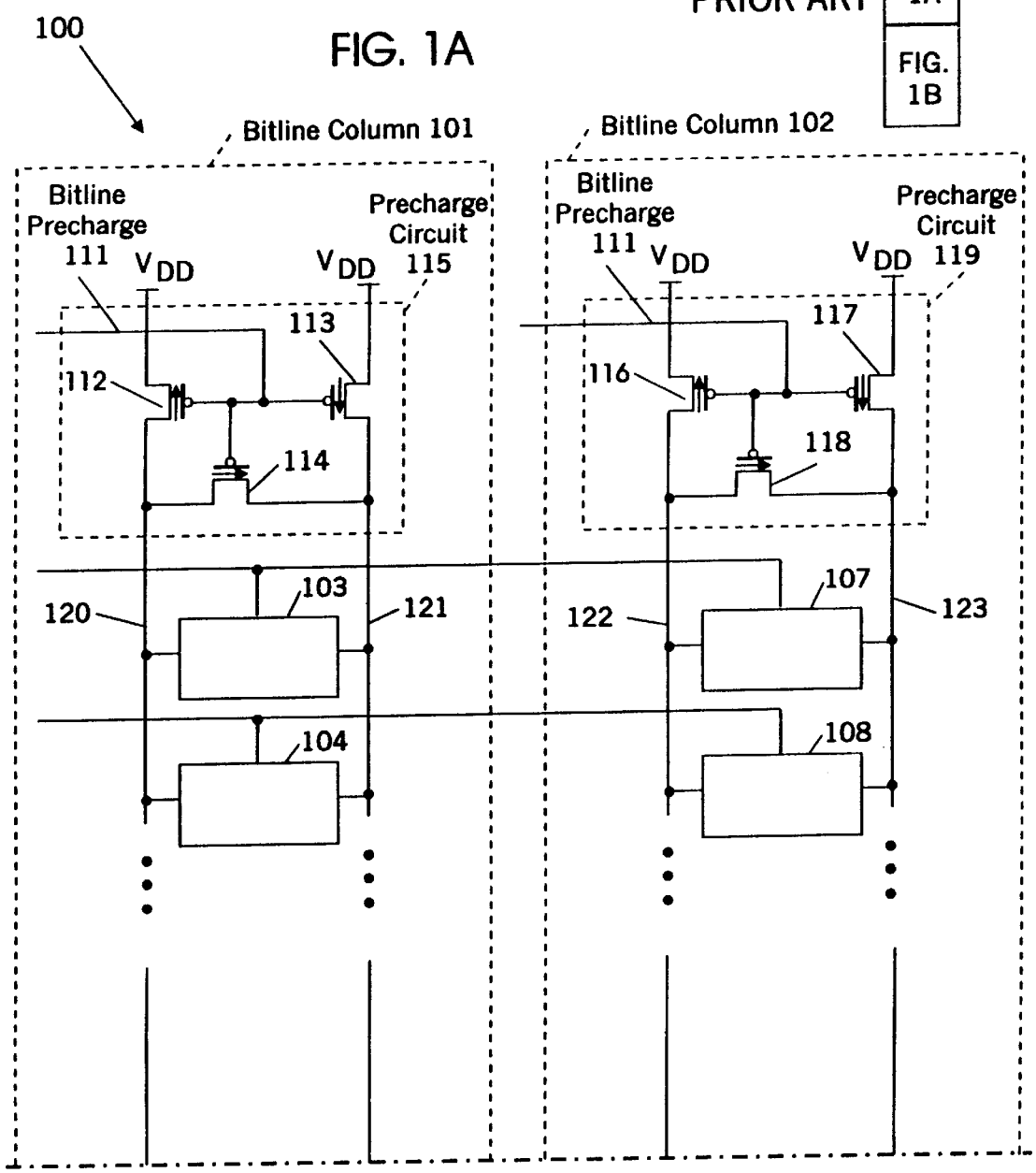
FIG. 1 illustrates a memory according to the prior art.
Figure 1B:
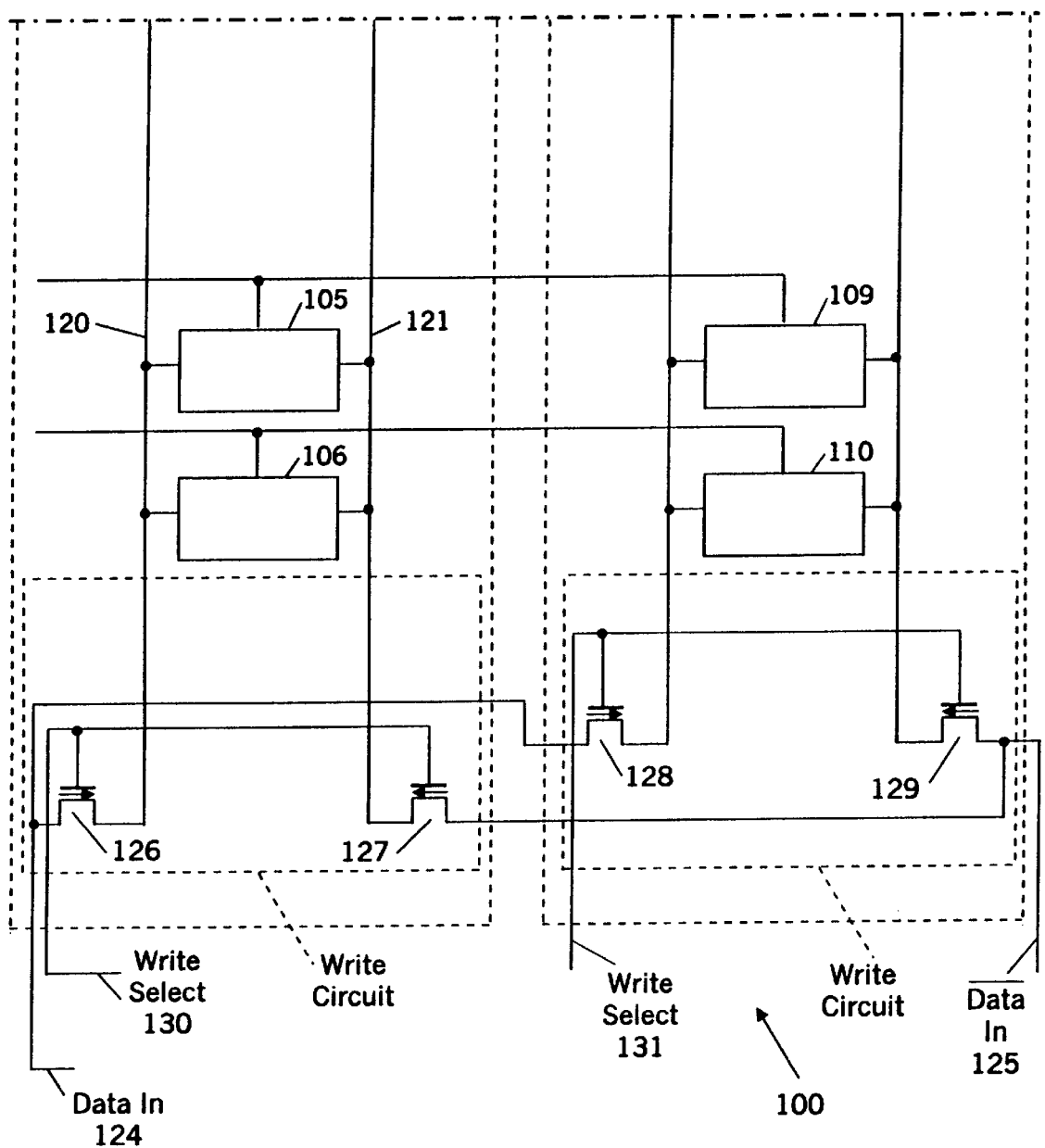

The present invention provides a memory having reduced bitline capacitances during write operations and the succeeding precharge operation. Memory cells within the memory are arranged in groups, each group being served by local bitlines. During a read operation, local bitlines are coupled to global bitlines which are further coupled to a data bus. During a write operation, the local bitlines are coupled to unidirectional write circuitry that receives the input data, and couples it to the local bitlines. In this way, the unidirectional write circuitry, during a write operation, need only discharge the capacitances associated with the local bitlines. Similarly, a precharge following a write operation need only charge the capacitances associated with the local bitlines. Because the bitline capacitances of the local bitlines are reduced, and because of the reduced number of memory cells coupled to the bitlines, the bitline capacitance associated with the local bitlines is reduced, thereby reducing the write and succeeding precharge times.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art. Furthermore, during a description of the implementation of the invention, the terms "assert" and "negate" and various grammatical forms thereof, are used to avoid confusion when dealing with the mixture of "active high" and "active low" logic signals. "Assert" is used to refer to the rendering of a logic signal or register bit into its active, or logically true, state. "Negate" is used to refer to the rendering of a logic signal or register bit into its inactive, or logically false, state.

Refer now to the drawings wherein depicted elements are not necessarily shown to scale and wherein like or similar elements are designated by the same reference numeral through the several views.

Figure 2:
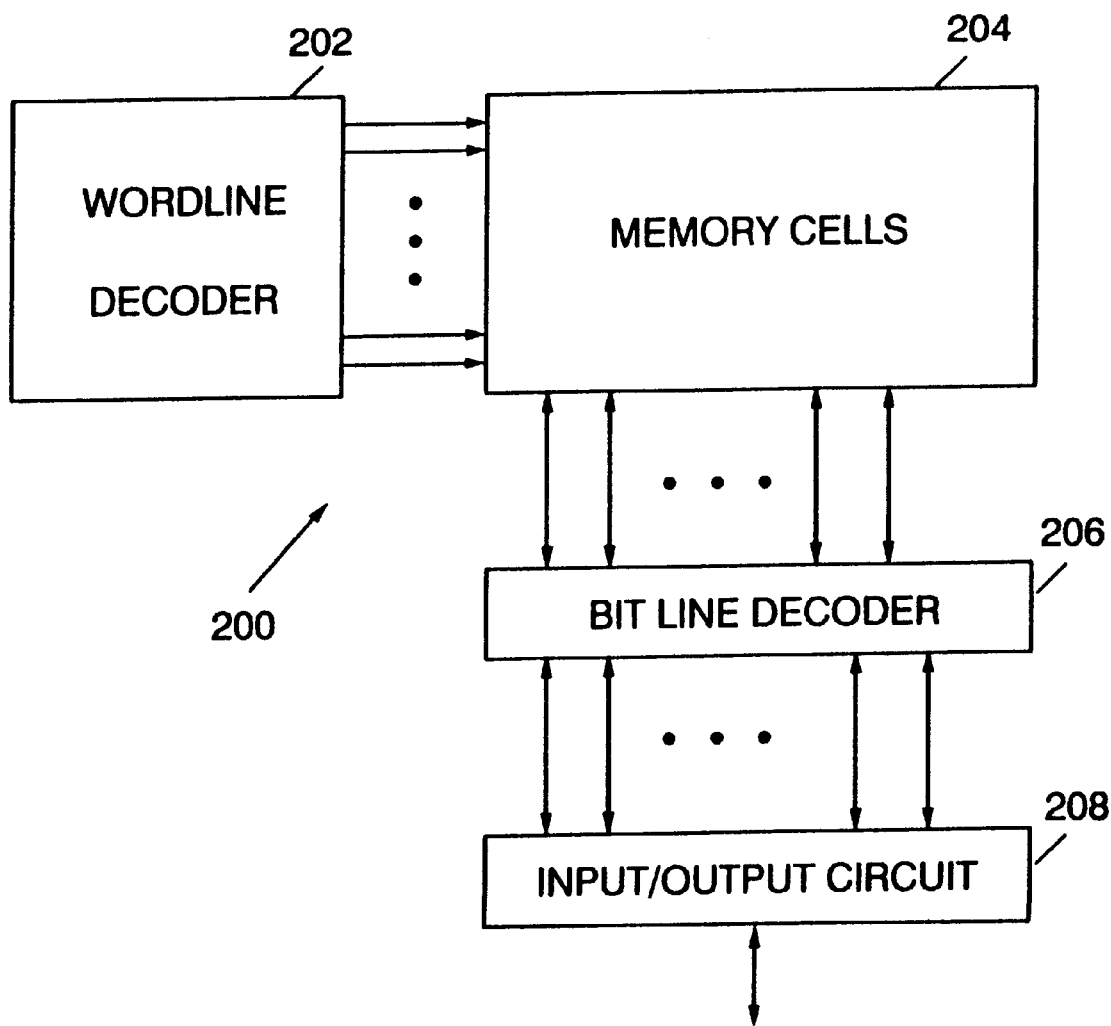
FIG. 2 illustrates, in block diagram form, a memory system in accordance with one embodiment of the present invention.

FIG. 2 illustrates a memory system 200 in accordance with one embodiment of the present invention. Note that the memory system of the present invention may be implemented in RAM 514 (FIG. 5), ROM 516 (FIG. 5), or a cache (not shown) of data processing system 500 (FIG. 5) or another memory device not illustrated in detail therein.

Memory system 200 comprises a wordline decoder 202, a plurality of memory cells 204, a bitline decoder 206, and an input/output circuit 208. Wordline decoder 202 is coupled to memory cells 204 to provide a plurality of decoded data. Additionally, bitline decoder 206 is coupled to the plurality of memory cells 204 to communicate data which has been decoded or will be decoded. Input/output circuit 208 is coupled to bitline decoder 206 to communicate data with bitline decoder 206 and to determine a value which corresponds to that data.

Figure 3A:
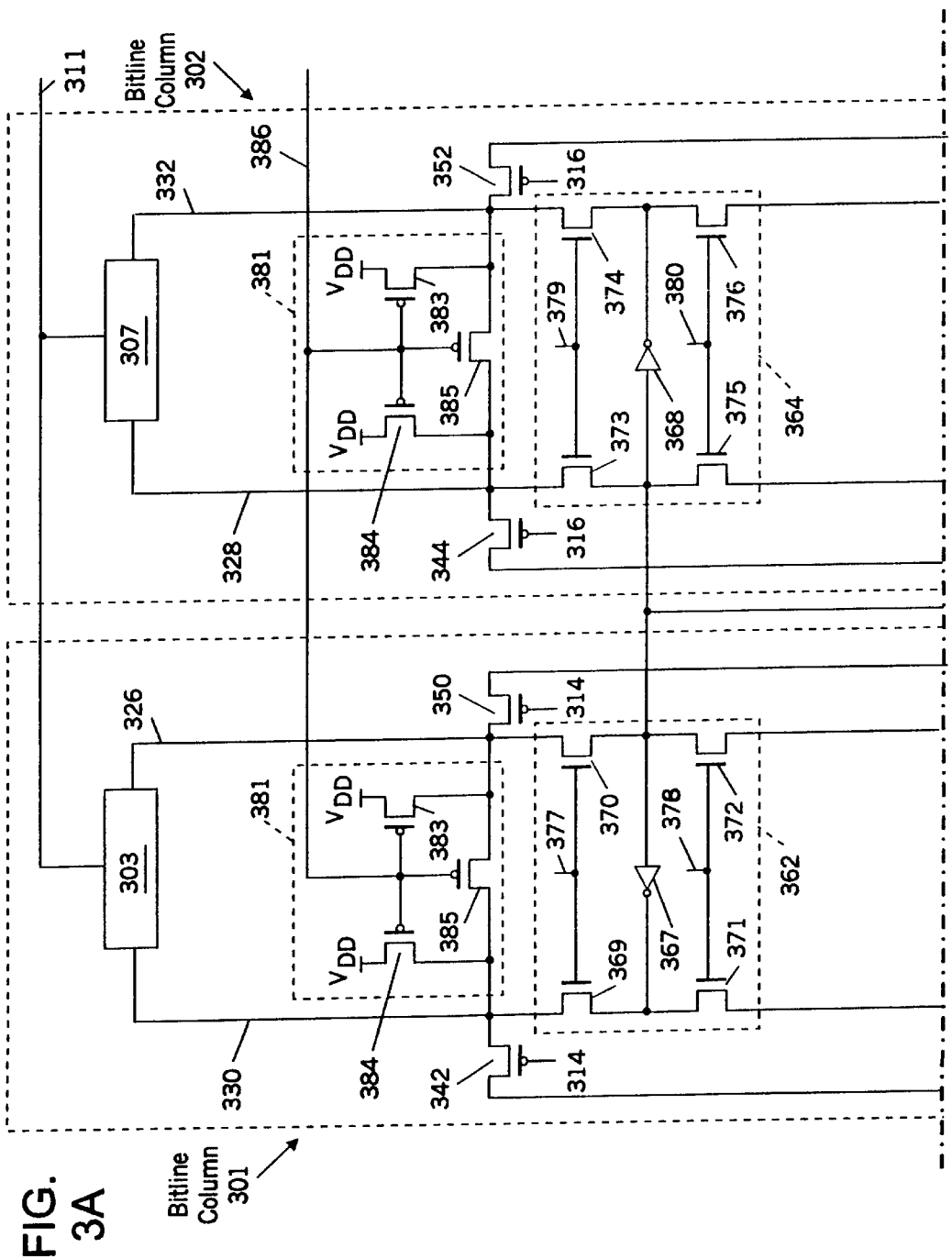
FIG. 3 illustrates, in partial schematic form, a memory subsystem in accordance with an embodiment of the present invention.

FIG. 3 depicts a subsystem 300 of memory system 200, in accordance with the principles of the present invention. Subsystem 300 includes bitline columns 301 and 302. Within each of the bitline columns, are memory cell groups 303 and 305, in bitline column 301, and memory cell groups 307 and 309 in bitline column 302. Each of memory cell groups 303, 305, 307 and 309 include a plurality of memory cells (not shown) for the storage of data. A row of cells is accessed by a row address signal on a plurality of wordlines 311 and 313. It is understood that each row of memory cells in groups 303 and 307 is row-addressed by one of the plurality of wordlines 311, and likewise, each row of cells in groups 305 and 309 is row-addressed by one of the plurality of wordlines 313.

A read from memory is made via global bitlines. Global bitline 322 and its complement global bitline 323 provide read access to memory cell groups 303 and 305 in bitline column 301. Similarly, global bitline 324, and its complement, global bitline 325, provide read access to memory cell groups 307 and 309 in bitline column 302.

Read access is effected by coupling local bitlines associated with each memory cell group with the global bitlines. Memory cell groups 303, 305, 307 and 309 include local bitlines coupled to the global bitlines associated with the memory cell group's bitline column. Each of memory cell groups 303, 305, 307 and 309 has a corresponding local bitline, one of local bitlines 326–329. Associated with each local bitline 326–329, is a corresponding complementary bitline, local bitlines 330–333, respectively. Local bitlines 326 and 327 are coupled to global bitline 322 through word switches 350 and 351, respectively. Similarly, local bitlines 328 and 329 are coupled to global bitline 324 through word switches 344 and 345. The complementary local bitlines, local bitlines 330 and 331, in bitline column 301, and local bitlines 332 and 333, in bitline column 302, are coupled to their respective complementary global bitlines, global bitline 323 and global bitline 325 by word switches 342 and 343 and word switches 352 and 353, respectively. These are turned on during a read from a cell in one of memory cell groups 303, 305, 307 and 309 by the assertion of the group select signal on a corresponding group select line 314–317. When the corresponding word switches 342–345 and 350–353 turn on, the local bitlines are thereby coupled to the associated global bitline, and similarly for the complementary local bitlines with respect to their associated complementary global bitlines. Global bitlines 322 and 324, and their respective complements, $\overline{\text{global}}$ bitlines 323 and 325, are further coupled to a read data bus via column switches, none of which are shown, for simplicity.

Writing to one of memory cell groups 303, 305, 307 and 309 is effected through the local bitlines 326–329 and the corresponding complementary bitlines, $\overline{\text{local}}$ bitlines 330–333. Data to be written to one of memory cell groups 303, 305, 307 and 309 is provided on write data bus 366. Write data bus 366 does not have an associated complementary bus. Write data bus 366 is coupled to the local bitline/ $\overline{\text{local}}$ bitline pairs via write units 362 and 364. Write unit 362 includes inverter 367, and NMOS devices 369–372. Write unit 364 contains inverter 368 and NMOS devices 373–376. The complementary signal to the write data on write data bus 366 is provided by inverters 367 and 368. For a write to cell group 303, write select 377 is asserted, turning on NMOS devices 369 and 370. Similarly for a write to cell group 305, write select 378 is asserted, turning on NMOS devices 371 and 372. Turning on MOS device 369 couples the output of inverter 367 to $\overline{\text{local}}$ bitline 330 in cell group 303, and turning on NMOS device 370 couples write data bus 366 to local bitline 326 in cell group 303. Similarly, turning on NMOS device 371 and 372 respectively couples the output of inverter 367 to $\overline{\text{local}}$ bitline 331 and local bitline 327 to write data line 366, for a write to a cell in cell group 305. A write to one of cell groups 307 and 309 in bitline column 302 operates in the same fashion. Asserting write select signal 379 turn on NMOS devices 373 and 374. The output of inverter 368 is thereby coupled to $\overline{\text{local}}$ bitline 332 and write data bus 366 is coupled to local bitline 328. Similarly, asserting write select signal 380 turns on NMOS devices 375 and 376, thereby respectively coupling the output of inverter 368 to $\overline{\text{local}}$ bitline 333 and write data 366 to local bitline 329. In an alternative embodiment, write select signals 377 and 378 may be tied together, and write select signals 379 and 380 tied together, whereby the write select signals serve as column select signals. In such an embodiment, selecting bitline column 301 couples local bitlines 326 and 327 to write data bus 366, and the output of inverter 367 to $\overline{\text{local}}$ bitlines 330 and 331. Likewise, selecting bitline column 302 couples local bitlines 328 and 329 to write data bus 366, and the output of inverter 368 to $\overline{\text{local}}$ bitlines 332 and 333.

Following a write operation, the local bitlines need to be restored. Bitline restoration is done through precharge circuits 381 and 382 associated with each of bitline columns 301 and 302. P-type metal oxide semiconductor (PMOS) devices 383–385 are "normally open" switches. During precharge they are rendered active ("closed") by asserting a signal on precharge line 386. Asserting bitline precharge line 386 turns on PMOS devices 383–385. This couples local bitlines 326 and 328, and $\overline{\text{local}}$ bitlines 330 and 332 to a voltage source. PMOS devices 385 equalize local bitline 326 and $\overline{\text{local}}$ bitline 330, and local bitline 328 and $\overline{\text{local}}$ bitline 332. During precharge of the local bitline pairs through precharge circuits 381, the global bitlines are isolated from the local bitlines by word switches 342, 350, 344 and 352, by negating group select lines 314 and 316. Local bitlines 327 and $\overline{\text{local}}$ bitline 331, and $\overline{\text{local}}$ bitline 329 and $\overline{\text{local}}$ bitline 333 are similarly precharged by precharge circuits 382. Precharge of these local bitline pairs is effected by asserting precharge signal 387. During precharge of the local bitline pairs through precharge circuits 382, the global bitlines are isolated from the local bitlines by word switches 343, 351, 345 and 353 by negating group select lines 315 and 317.

The precharge of the global bitlines is accomplished through global precharge units 388. Global precharge unit 388 precharges global bitlines 322 and 324 and $\overline{\text{global}}$ bitlines 323 and 325 in response to the assertion of global precharge signal 389. By separating the precharging of the local bitlines following a write operation, from global precharge, the time for write and restore operations is reduced. Global precharge units 388 may constitute a plurality of PMOS devices in similar fashion to precharge circuits 381 and 382. There is no need to precharge the write bus because it is isolated from the local bitlines. Therefore, it is unidirectional. By eliminating the write restore time, the total array cycle time is reduced.

Although each of bitline columns 301 and 302, for simplicity, have been illustrated as including two cell groups, a bitline column according to the principles of the present invention may have a predetermined number, m, of cell groups. Each of the m cell groups may have an associated write unit, such as write unit 362. Alternatively, each bitline column may have a plurality of subsets of cell groups including a predetermined number, n, of cell groups served by an associated write unit.

Figure 4:
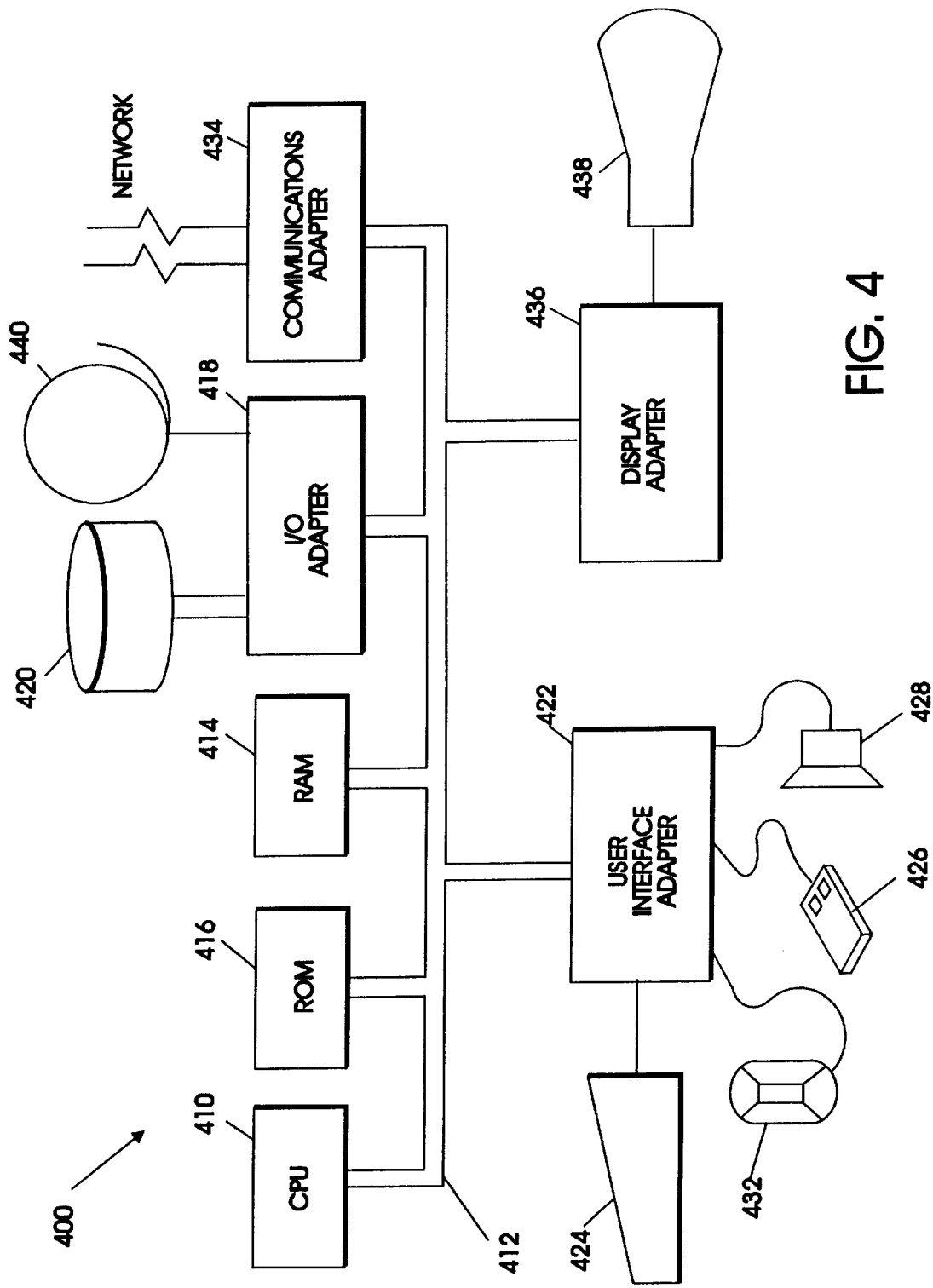
FIG. 4 illustrates, in block diagram form, a data processing system in accordance with one embodiment of the present invention.

Referring now to FIG. 4, an example is shown of a data processing system 400 which may be used for the invention. The system has a central processing unit (CPU) 410, such as a POWERPC microprocessor ("PowerPC" is a trademark of IBM Corporation) according to "The PowerPC Architecture: A Specification for a New Family of RISC Processors", 2d edition, 1994, Cathy May, et al. Ed., which is hereby incorporated herein by reference. A more specific implementation of a PowerPC microprocessor is described in the "PowerPC 604 RISC Microprocessor User's Manual", 1994, IBM Corporation, which is hereby incorporated herein by reference. The CPU 410 is coupled to various other components by system bus 412. Read only memory ("ROM") 416 is coupled to the system bus 412 and includes a basic input-output system ("BIOS") that controls certain basic functions of the data processing system 400. Random access memory ("RAM") 414, I/0 adapter 418, and communications adapter 434 are also couple to the system bus 412. I/O adapter 418 may be a small computer system interface ("SCSI") adapter that communicates with a disk storage device 420. Communications adapter 434 interconnects bus 412 with an outside network enabling the data processing system to communication with other such systems. Input/Output devices are also connected to system bus 412 via user interface adapter 422 and display adapter 436. Keyboard 424, track ball 432, mouse 426 and speaker 428 are all interconnected to bus 412 via user interface adapter 422. Display monitor 438 is connected to system bus 412 by display adapter 436. In this manner, a user is capable of inputting to the system throughout the keyboard 424, trackball 432 or mouse 426 and receiving output from the system via speaker 428 and display 438. Additionally, an operating system such as AIX ("AIX" is a trademark of the IBM Corporation) is used to coordinate the functions of the various components shown in FIG. 4.

Although the present invention and its advantages have been described in detail, it should be understood that various changes, substitutions and alterations can be made herein without departing from the spirit and scope of the invention as defined by the appended claims.

What is claimed is:

1. A data processing system comprising:
   a processor coupled via a bus to a storage system, a memory system, and an input/output system, wherein a memory system is located within one of said processor, storage system, memory system, or input/output system, said memory system further comprising:

a plurality of memory cells wherein said plurality of memory cells is partitioned into first and second memory cell groups;

a first bitline coupled to said first memory group;

a second bitline coupled to said second memory group;

a third bitline coupled to said first and second bitlines for communicating read data from said first and second memory cell groups;

a data line coupled to said first and second bitlines for communicating write data to said first and second memory cell groups;

a first precharge unit coupled to the first and second bitlines for precharging said first and second bitlines in response to a first precharge signal; and a second precharge unit coupled to the third bitline for precharging the third bitline in response to a second precharge signal.

2. The data processing system of claim 1 wherein said first bitline is coupled to said data line by a first switch and said second bitline is coupled to said data line by a second switch.

3. The data processing system of claim 2 wherein said first and second switches are adapted for receiving first and second signals, respectively, from column decoder circuitry.

4. The data processing system of claim 2 wherein said first bitline is coupled to said data line in response to a first signal sent to said first switch and said second bitline is coupled to said data line in response to a second signal sent to said second switch.

5. The data processing system of claim 1 wherein said first bitline is coupled to said third bitline by a first switch and said second bitline is coupled to said third bitline by a second switch.

6. The data processing system of claim 5 wherein said first and second bitlines are coupled to said third bitline in response to a signal sent to said first and second switches.

* * * * *